United States Patent
Ko

(10) Patent No.: US 9,906,132 B1
(45) Date of Patent: Feb. 27, 2018

(54) DC-TO-DC CONVERTING CIRCUIT AND INTEGRATED CIRCUIT OF POWER CIRCUIT

(71) Applicant: uPI Semiconductor Corp., Hsinchu County (TW)

(72) Inventor: Sheng-An Ko, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/466,890

(22) Filed: Mar. 23, 2017

(30) Foreign Application Priority Data

Dec. 15, 2016 (TW) .............................. 105141556 A

(51) Int. Cl.
*H02M 3/158* (2006.01)
*H02M 1/32* (2007.01)

(52) U.S. Cl.
CPC .............. *H02M 3/158* (2013.01); *H02M 1/32* (2013.01); *H02M 2001/327* (2013.01)

(58) Field of Classification Search
CPC .... H02M 3/156–3/158; H02M 3/1584; H02M 3/1588; G05F 1/46; G05F 1/52; G05F 1/63; Y02B 70/1466; H02J 1/102
USPC ....... 323/271, 272, 274, 275, 277, 282, 284, 323/285
See application file for complete search history.

(56) References Cited

U.S. PATENT DOCUMENTS

| | | | | |
|---|---|---|---|---|
| 2,939,018 A | * | 5/1960 | Faulkner | G01R 19/16538 327/199 |
| 5,627,460 A | * | 5/1997 | Bazinet | G05F 1/618 323/224 |
| 6,201,717 B1 | * | 3/2001 | Grant | H02M 3/07 363/131 |
| 8,436,592 B2 | * | 5/2013 | Saitoh | H02M 3/1582 323/225 |
| 2005/0180236 A1 | * | 8/2005 | Thiele | H02M 1/36 365/203 |

\* cited by examiner

*Primary Examiner* — Yemane Mehari
(74) *Attorney, Agent, or Firm* — JCIPRNET

(57) ABSTRACT

A DC-to-DC converting circuit includes a power switch unit, a second power switch, a phase node, a boosted circuit and a sensing circuit. The power switch unit includes a first power switch, a sensing element, a first end, a second end and a sensing end. The sensing element is connected to the sensing end and the first end. The first end is connected to an input voltage. The second power switch is connected to the first power switch. The phase node is located between the power switch unit and the second power switch and is connected to the second end. The boosted circuit boosts the input voltage to a first operation voltage and provides the first operation voltage to the sensing end. The first operation voltage is higher than the input voltage. The sensing circuit is connected to the boosted circuit and the sensing end to obtain a sensing voltage.

15 Claims, 6 Drawing Sheets

DC-TO-DC CONVERTING CIRCUIT AND INTEGRATED CIRCUIT OF POWER CIRCUIT

CROSS-REFERENCE TO RELATED APPLICATION

This application claims the priority benefit of Taiwan application serial no. 105141556, filed on Dec. 15, 2016. The entirety of the above-mentioned patent application is hereby incorporated by reference herein and made a part of this specification.

BACKGROUND OF THE INVENTION

1. Field of the Invention

The invention is related to the power conversion technology, and more particularly, to a DC-to-DC converting circuit and an integrated circuit of a power circuit.

2. Description of Related Art

DC-to-DC converting circuits can control power switches (upper-bridge switch and lower-bridge switch) through DC-to-DC controllers so as to convert input voltages to output voltages. Moreover, conventional DC-to-DC converting circuits are usually configured with sensing elements in the DC-to-DC controllers for achieving over-temperature protections. However, the power switches are components in the DC-to-DC converting circuits that generate the most heat, and thus the conventional DC-to-DC converting circuits are generally not high in detection accuracy, thereby being unable to avoid phenomena of overheating and burning. In addition, although some of the conventional DC-to-DC converting circuits are configured with the sensing elements in the power switches, the sensing elements are often only able to be disposed in the lower-bridge switches and are often only able to be operated when the lower-bridge switches are conducted, and thus are unable to effectively increase the detection accuracy of the DC-to-DC converting circuits.

SUMMARY OF THE INVENTION

The invention is directed to a DC-to-DC converting circuit and an integrated circuit of a power circuit, and uses a boosted circuit to boost an input voltage to a first operation voltage and then uses the first operation voltage to supply power to a sensing element in a power switch unit. As such, detection accuracies of the DC-to-DC converting circuit and the integrated circuit of the power circuit can be enhanced.

A DC-to-DC converting circuit of the invention receives an input voltage and includes a power switch unit, a second power switch, a phase node, a boosted circuit, and a sensing circuit. The power switch unit includes a first power switch, a sensing element, a first end, a second end, and a sensing end. The sensing element is connected to the sensing end and the first end, and the first end is connected to the input voltage. The second power switch is connected to the first power switch. The phase node is located between the power switch unit and the second power switch, and is connected to the second end. The boosted circuit is connected to the first end and the second end, boosts the input voltage to a first operation voltage, and provides the first operation voltage to the sensing end. The first operation voltage is higher than the input voltage. The sensing circuit is connected to the boosted circuit and the sensing end to obtain a sensing voltage.

An integrated circuit of a power circuit of the invention is connected to a power switch unit, a second power switch and a bootstrap capacitor, and receives an input voltage. The power switch unit includes a first power switch, a sensing element, a first end, a second end, and a sensing end. The sensing element is connected to the sensing end and the first end. The first end is connected to the input voltage. The second power switch is connected to the first power switch. The integrated circuit includes a phase pin, a boost component and a sensing circuit. The phase pin is connected to the second power switch and the second end of the power switch unit. The boost component is connected to the first end and the bootstrap capacitor. The boost component and the bootstrap capacitor boost the input voltage to a first operation voltage, and provide the first operation voltage to the sensing end. The first operation voltage is higher than the input voltage. The sensing circuit is connected to the boost component and the sensing end to obtain a sensing voltage.

An integrated circuit of a power circuit of the invention receives an input voltage and is connected to a bootstrap capacitor. The integrated circuit includes a power switch unit, a second power switch, a phase node, and a boost component. The power switch unit includes a first power-switch, a sensing element, a first end, a second end, and a sensing end. The sensing element is connected to the sensing end and the first end, and the first end is connected to the input voltage. The second power switch is connected to the first power switch. The phase node is connected to the second power switch and the second end. The boost component is connected to the first end and the bootstrap capacitor. The boost component and the bootstrap capacitor boost the input voltage to a first operation voltage, and provide the first operation voltage to the sensing end. The first operation voltage is higher than the input voltage.

In view of the above, the DC-to-DC converting circuit and the integrated circuit of the power circuit of the invention can use the boosted circuit formed by the boost component and the bootstrap capacitor to boost the input voltage to the first operation voltage and then use the first operation voltage to supply power to the sensing element in the power switch unit. As a result, the detection accuracies of the DC-to-DC converting circuit and the integrated circuit of the power circuit can be enhanced.

In order to make the aforementioned features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
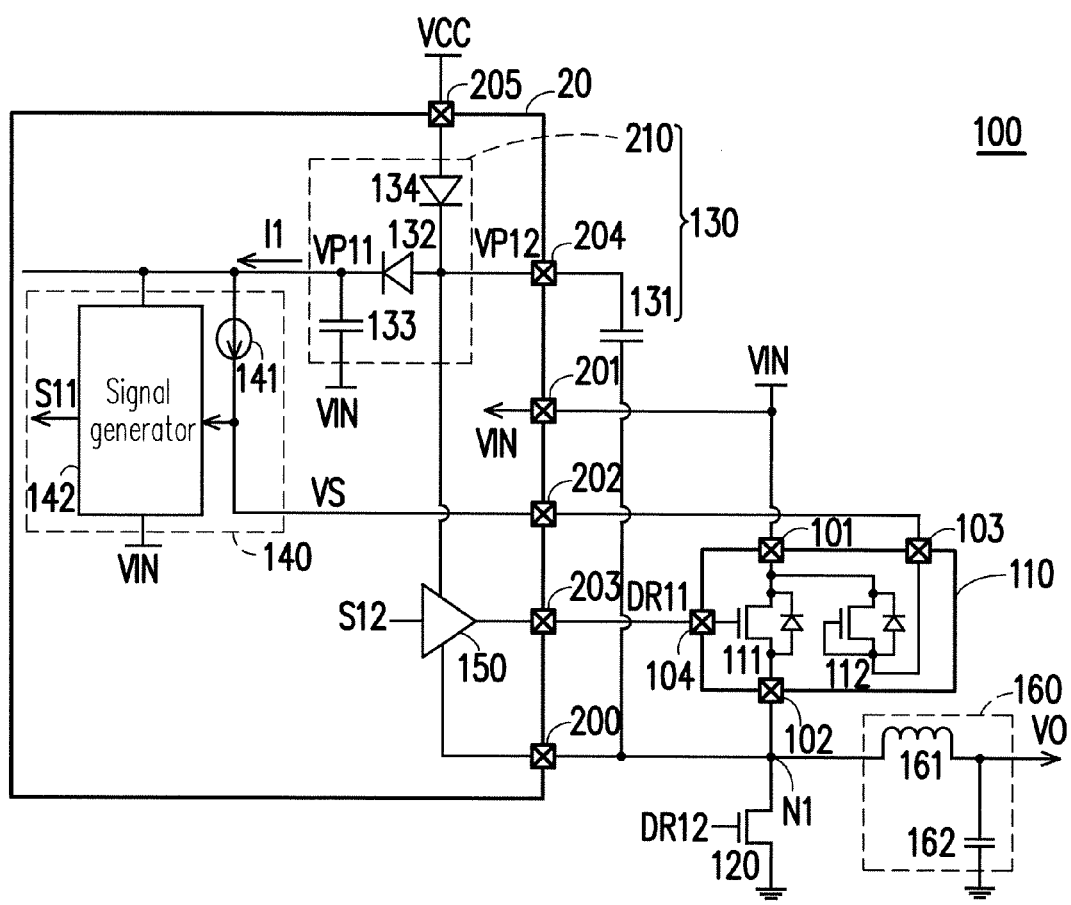
FIG. 1 is a schematic diagram illustrating a DC-to-DC converting circuit according to an embodiment of the invention.

FIG. 1 is a schematic diagram illustrating a DC-to-DC converting circuit according to an embodiment of the invention. As shown in FIG. 1, the DC-to-DC converting circuit 100 receives an input voltage VIN, and the DC-to-DC converting circuit 100 includes an integrated circuit 20 of a power circuit, a power switch unit 110, a second power switch 120, a bootstrap capacitor 131, and an impedance circuit 160. The power switch unit 110 and the second power switch 120 have a phase node N1 therebetween.

The power switch unit 110 includes a first power switch 111, a sensing element 112, a first end 101, a second end 102, a sensing end 103, and a third end 104. In one embodiment, the sensing element 112 is a temperature sensor.

In the present embodiment, the power switch unit 110 and the second power switch 120 are an integrated circuit, and the first power switch 111 and the sensing element 112 are metal-oxide-semiconductor transistors manufactured in a same process. The first end 101, the second end 102, the sensing end 103, and the third end 104 are respectively pins of the power switch unit 110. The sensing element 112 is connected to the sensing end 103 and the first end 101, and the first end 101 is connected to the input voltage VIN. The second power switch 120 is connected to the first power switch 111. In other embodiments, the power switch unit 110 and the second power switch 120 may also be integrated with the DC-to-DC controller 20 in a same integrated circuit.

The phase node N1 is located between the power switch unit 110 and the second power switch 120, and is connected to the second end 102 of the power switch unit 110.

The integrated circuit 20 of the power circuit includes a sensing circuit 140, a driver 150, a boost component 210, and other power conversion control circuits. The sensing circuit 140 is connected to the boosted circuit 130 and the sensing end 103 of the power switch unit 110.

The boosted circuit 130 includes a boost component 210 and a bootstrap capacitor 131. The boosted circuit 130 is connected to the first end 101 and the second end 102 of the power switch unit 110. In other words, an end of the boost component 210 in the boosted circuit 130 is connected to the first end 101 of the power switch unit 110, and an end of the bootstrap capacitor 131 in the boosted circuit 130 is connected to the phase node N1 and the second end 102 of the power switch unit 110.

The boost component 210 includes a first current limiting element 132, a capacitor 133 and a second current limiting element 134. The bootstrap capacitor 131 is connected to the phase node N1, the first pin 200 of the integrated circuit 20 of the power circuit and the fourth pin 204 of the integrated circuit 20 of the power circuit. The first current limiting element 132 is connected to the bootstrap capacitor 131 through the fourth pin 204. The capacitor 133 is connected between the first current limiting element 132 and the input voltage VIN. The second current limiting element 134 receives a power supply voltage VCC, and is connected to a connecting node between the bootstrap capacitor 131 and the first current limiting element 132.

The sensing circuit 140 includes a current source 141 and a signal generator 142, and is connected to the first current limiting element 132 and the capacitor 133. The sensing circuit 140 is connected to the sensing end 103 of the power switch unit 110 through the second pin 202 of the integrated circuit 20 of the power circuit. A first power supply end of the driver 150 is connected to the connecting node between the bootstrap capacitor 131 and the first current limiting element 132, and receives a second operation voltage VP12. A second power supply end of the driver 150 is connected to the phase node N1. An output end of the driver 150 is connected to the third end 104 of the power switch unit 110. The impedance circuit 160 includes an inductor 161 and a capacitor 162.

In terms of operation, the power switch unit 110, the second power switch 120 and the impedance circuit 160 can convert the input voltage VIN into an output voltage VO. The DC-to-DC converting circuit 100 can use driving signals DR11~DR12 to switch the first power switch 111 and the second power switch 120, and the impedance circuit 160 can provide the output voltage VO in response to the switchings of the first power switch 111 and the second power switch 120.

Figure 2:
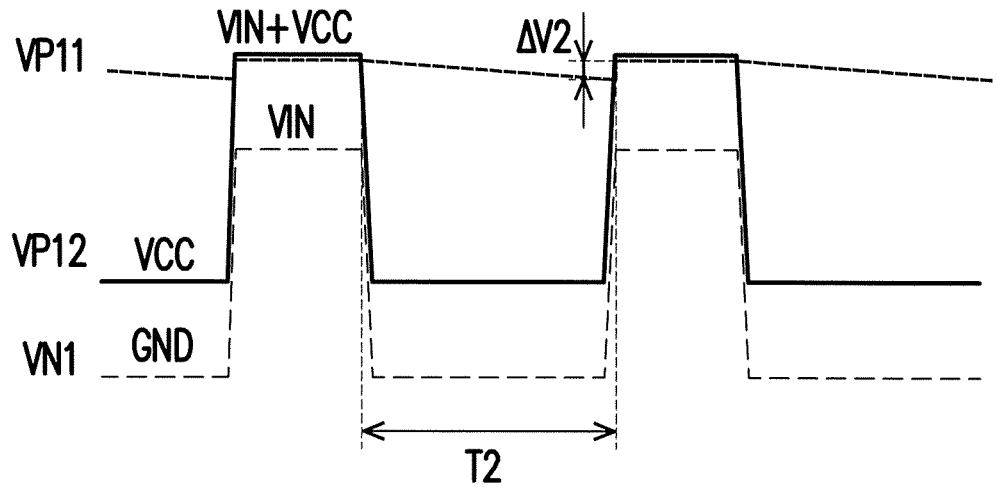
FIG. 2 is a timing diagram for illustrating the DC-to-DC converting circuit according to an embodiment of the invention.

On the other hand, the boosted circuit 130 can generate a first operation voltage VP11 which is higher than the input voltage VIN in response to the switchings of the first power switch 111 and the second power switch 120. For instance, FIG. 2 is a timing diagram for illustrating the DC-to-DC converting circuit according to one embodiment of the invention. FIG. 2 illustrate the first operation voltage VP11, a node voltage VN1 located on the phase node N1 and the second operation voltage VP12 of the boosted circuit 130 which is generated through the bootstrap capacitor 131.

Referring to FIG. 1 and FIG. 2, when the first power-switch 111 is not conducted while the second power switch 120 is conducted, the node voltage VN1 is pulled down to a ground voltage GND. At this moment, the second current limiting element 134 is conducted and the bootstrap capacitor 131 is charged to a power supply voltage VCC, thereby causing the second operation voltage VP12 to be equal to the power supply voltage VCC. When the first power switch 111 is conducted while the second power switch 120 is not conducted, the node voltage VN1 is pulled up to the input voltage VIN. At this moment, the power supply voltage VCC stored by the bootstrap capacitor 131 is added up with the input voltage VIN, thereby causing the second operation voltage VP12 to be equal to a sum of the power supply voltage VCC and the input voltage VIN, that is, VP12=VIN+VCC. At this moment, the first current limiting element 132 is conducted. Thus, the capacitor 133 can be charged, and the first operation voltage VP11 generated by the charged capacitor 133 is approximately equal to a sum of the power supply voltage VCC and the input voltage VIN.

When the first power switch 111 is again not conducted while the second power switch 120 is again conducted, the second current limiting element 134 is conducted and the first current limiting element 132 is not conducted. At this moment, the bootstrap capacitor 131 is again charged to the power supply voltage VCC, thereby causing the second operation voltage VP12 to be equal to the power supply voltage VCC. In addition, since the first current limiting element 132 is not conducted, the first operation voltage VP11 generated by the capacitor 133 can be maintained at the sum (that is, VIN+VCC). When the first power switch 111 is again conducted while the second power switch 120 is again not conducted, the second current limiting element 134 is not conducted and the first current limiting element 132 is conducted. Thus, the second operation voltage VP12 is equal to the sum of the power supply voltage VCC and the input voltage VIN, and the first operation voltage VP11 generated by the capacitor 133 is also approximately the sum of the power supply voltage VCC and the input voltage VIN.

In other words, the boosted circuit 130 can boost the input voltage VIN to the first operation voltage VP11 and then provide the first operation voltage VP11 to the sensing end 103 of the power switch unit 110. Furthermore, the current source 141 in the sensing circuit 140 can provide an operation current to the sensing end 103 of the power switch unit 110 in response to the first operation voltage VP11, so as to drive the sensing element 112 that is connected to the sensing end 103. As driven by the operation current, the sensing element 112 can generate a sensing voltage VS according to a temperature of the first power switch 111 and can send the sensing voltage VS to the sensing circuit 140 through the sensing end 103.

In other words, the DC-to-DC converting circuit 100 by generating the first operation voltage VP11, which is higher than the input voltage VIN, through the boosted circuit 130 and by using the first operation voltage VP11 to supply power to the sensing element 112, enables a voltage of the sensing end 103 to be greater than the input voltage VIN of the first end 101, thereby ensuring that the sensing element 112 can function normally. That is, during the period of performing the power conversion, the DC-to-DC converting circuit 100 can continuously determine a temperature variation of the first power switch 111 according to the sensing voltage VS generated by the sensing element 112, so as to increase a detection accuracy of the DC-to-DC converting circuit 100, and thus enables the DC-to-DC converting circuit 100 to accurately control its internal temperature and is facilitative in achieving an over-temperature protection.

In actual operation, during the period in which the first power switch 111 is not conducted while the second power switch 120 is conducted, the sensing element 112 uses the energy stored by the capacitor 133 to supply power; namely, the capacitor 133 discharges and outputs a current I1 during this period. Therefore, as shown in FIG. 2, during a conduction period T2 of the second power switch 120, the first operation voltage VP11 generated by the capacitor 133 is slightly lowered for about a voltage difference ΔV2. For instance, when the first power switch 111 is conducted, the first operation voltage VP11 is as shown in Formula (1), and when the second power switch 120 is conducted, the first operation voltage VP11 is as shown in Formula (2). "C" in the Formula (2) is used to represent the capacitance of the capacitor 133.

$$VP11 = (VIN + VCC) \quad \text{Formula (1)}$$

$$VP11 = (VIN + VCC) - \frac{I1 \times T2}{2 \times C} \quad \text{Formula (2)}$$

In order for the sensing element 112 to function normally in the conduction period of the first power switch 111 and the conduction period of the second power switch 120, respectively, the first operation voltages VP11 as shown in the Formula (1) and the Formula (2) must all be greater than the input voltage VIN; that is, VP11>VIN. On the other hand, in order to ensure that the sensing element 112 to function normally during the conduction period of the second power switch 120, a relationship between the power supply voltage VCC, the conduction period T2 of the second power switch 120, the capacitance C of the capacitor 133, and the current I1 is as shown in Formula (3).

$$VCC > \frac{I1 \times T2}{2 \times C} \quad \text{Formula (3)}$$

Figure 3:
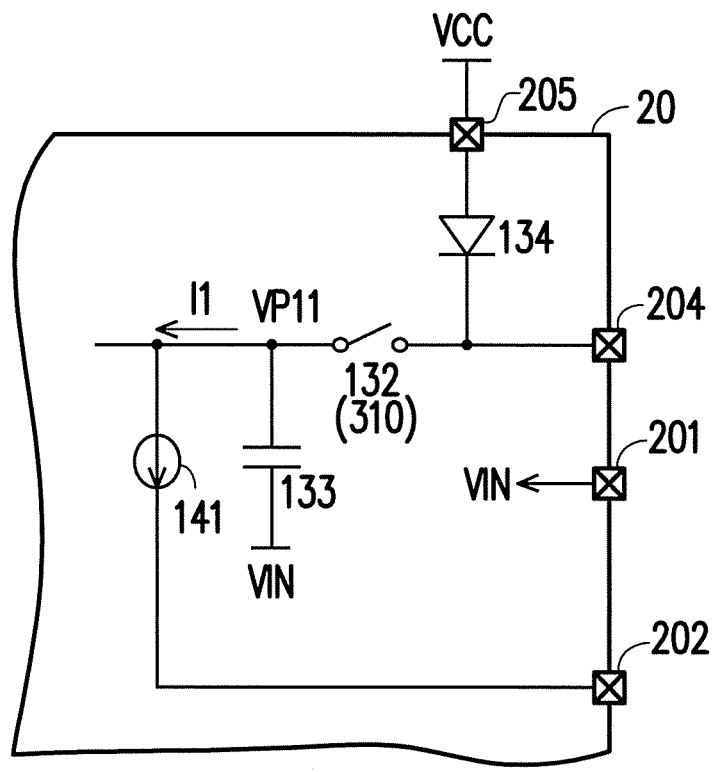
FIG. 3 is a schematic diagram illustrating a part of the DC-to-DC converting circuit according to an embodiment of the invention.

Referring to FIG. 1, the first current limiting element 132 and the second current limiting element 134 are respectively included diodes. In another embodiment, the first current limiting element 132 and the second current limiting element 134 may also be respectively included switches. For instance, FIG. 3 is a schematic diagram illustrating a part of the DC-to-DC converting circuit according to an embodiment of the invention. As shown in FIG. 3, the first current limiting element 132 can be included a switch 310, and the switch 310 is synchronized with the first power switch 111. That is, when the first power switch 111 is conducted, the switch 310 is also conducted; and when the first power switch 111 is not conducted, the switch 310 is also not conducted.

The sensing circuit 140 includes the current source 141 and the signal generator 142. The signal generator 142 is electrically connected to the sensing end 103 of the power switch unit 110 to receive the sensing voltage VS generated by the sensing element 112. The signal generator 142 is operated between the first operation voltage VP11 and the input voltage VIN, and can generate a temperature detection signal S11 according to the sensing voltage VS.

Figure 4:
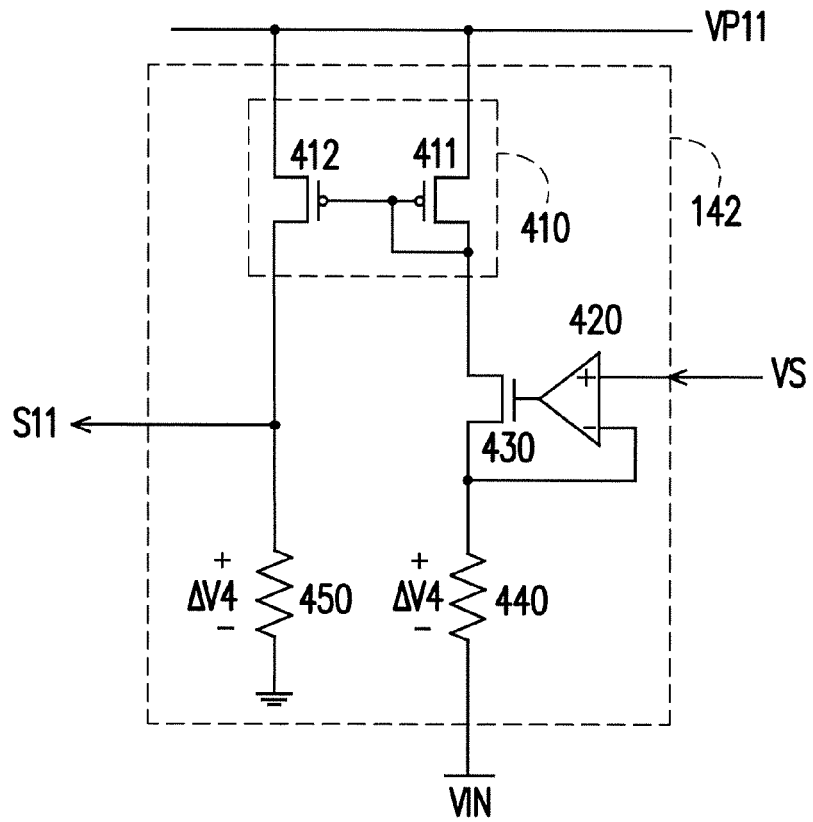
FIG. 4 is a schematic diagram illustrating a signal generator according to an embodiment of the invention.

For instance, FIG. 4 is a schematic diagram illustrating a signal generator according to an embodiment of the invention. As shown in FIG. 4, the signal generator 142 includes a current mirror 410, an operational amplifier 420, an N channel transistor 430, and resistors 440 and 450. The current mirror 410 can be included P channel transistors 411 and 412, and the P channel transistors 411 and 412 receive the first operation voltage VP11. A first input end of the operational amplifier 420 receives the sensing voltage VS. A first end of the N channel transistor 430 is electrically connected to the P channel transistor 411, a control end of the N channel transistor 430 is electrically connected to an output end of the operational amplifier 420, and a second end of the N channel transistor 430 is electrically connected to a second input end of the operational amplifier 420. The resistor 440 is electrically connected between the second end of the N channel transistor 430 and the input voltage VIN. The resistor 450 is electrically connected between the P channel transistor 412 and the ground voltage, and generates the temperature detection signal S11.

In terms of operation, the operational amplifier 420 and the N channel transistor 430 form a clamping circuit, thereby enabling a first end of the resistor 440 to receive the sensing voltage VS. A second end of the resistor 440 receives the input voltage VIN, thereby enabling a voltage difference ΔV4, which is positively proportional to the temperature variation of the first power switch 111, to crossover the resistor 440. The current mirror 410 replicates a current that passes through the resistor 440, and thereby accordingly generates a current that passes through the resistor 450. The resistor 450 can generate the voltage difference ΔV4 with respect to the ground voltage. In other words, the temperature detection signal S11 in FIG. 4 is an analog signal; namely, the voltage difference ΔV4 that is positively proportional to the temperature variation of the first power switch 111. The DC-to-DC converting circuit 100 can monitor the temperature variation of the first power switch 111 according to the temperature detection signal S11.

Figure 5:
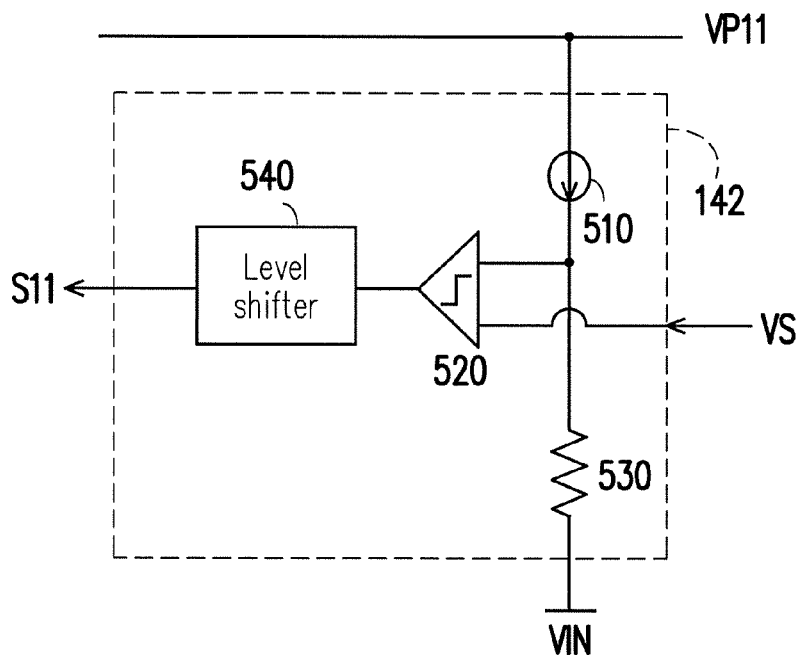
FIG. 5 is a schematic diagram illustrating a signal generator according to another embodiment of the invention.

FIG. 5 is a schematic diagram illustrating a signal generator according to another embodiment of the invention. As shown in FIG. 5, the signal generator 142 includes a current source 510, a comparator 520, a resistor 530, and a level shifter 540. The current source 510 receives the first operation voltage VP11. A first input end of the comparator 520 is electrically connected to the current source 510, and a second input end of the comparator 520 receives the sensing voltage VS. The resistor 530 is electrically connected between the current source 510 and the input voltage VIN. The level shifter 540 is electrically connected to an output end of the comparator 520. In terms of operation, the comparator 520 compares the sensing voltage VS with a voltage generated by the resistor 530 and then generates a comparison signal according to the comparison result. The level shifter 540 adjusts a level of the comparison signal and accordingly generates the temperature detection signal S11 which is capable to be used by a back-end circuit. In other words, the temperature detection signal S11 in FIG. 4 is a digital signal, and the DC-to-DC converting circuit 100 can decide whether to active an over-temperature protection mechanism based on the temperature detection signal S11.

Referring to FIG. 1, the first power supply end of the driver 150 receives the second operation voltage VP12. The second power supply end of the driver 150 is connected to the phase node N1. An output end of the driver 150 is connected to a control end of the first power switch 111. In addition, the driver 150 generates a driving signal DR11 for controlling the first power switch 111 according to a pulse width modulation signal S12. The boost component 210, the sensing circuit 140 and the driver 150 are integrated in an integrated circuit 20 so as to form the DC-to-DC controller.

The integrated circuit 20 of the power circuit receives the input voltage VIN and is connected to the power switch unit 110, the second power switch 120 and the bootstrap capacitor 131. Moreover, the integrated circuit 20 of the power circuit further includes a phase pin 200 and first to fifth pins 201-205. The phase pin 200 is connected to the second power switch 120 and the second end 102 of the power switch unit 110. The first pin 201 receives the input voltage VIN. The second pin 202 is connected to the sensing element 112 of the power switch unit 110, and the integrated circuit 20 sends the first operation voltage VP11 to the sensing end 103 of the sensing element 112 through the second pin 202.

The boost component 210 is connected to the first end 101 of the power switch unit 110 through the first pin 201, is connected to the bootstrap capacitor 131 through the fourth pin 204, and receives the power supply voltage VCC through the fifth pin 205. In addition, the boost component 210 and the bootstrap capacitor 131 boost the input voltage VIN to the first operation voltage VP11, and then provide the first operation voltage VP11 to the sensing end 103 of the power switch unit 110. The sensing circuit 140 is connected to the boost component 210 and the sensing end 103 of the power switch unit 110 to obtain the sensing voltage VS. The output end of the driver 150 is connected to the control end of the first power switch 111 through the third pin 203, and the second power supply end of the driver 150 is connected to the phase pin 200.

Figure 6:
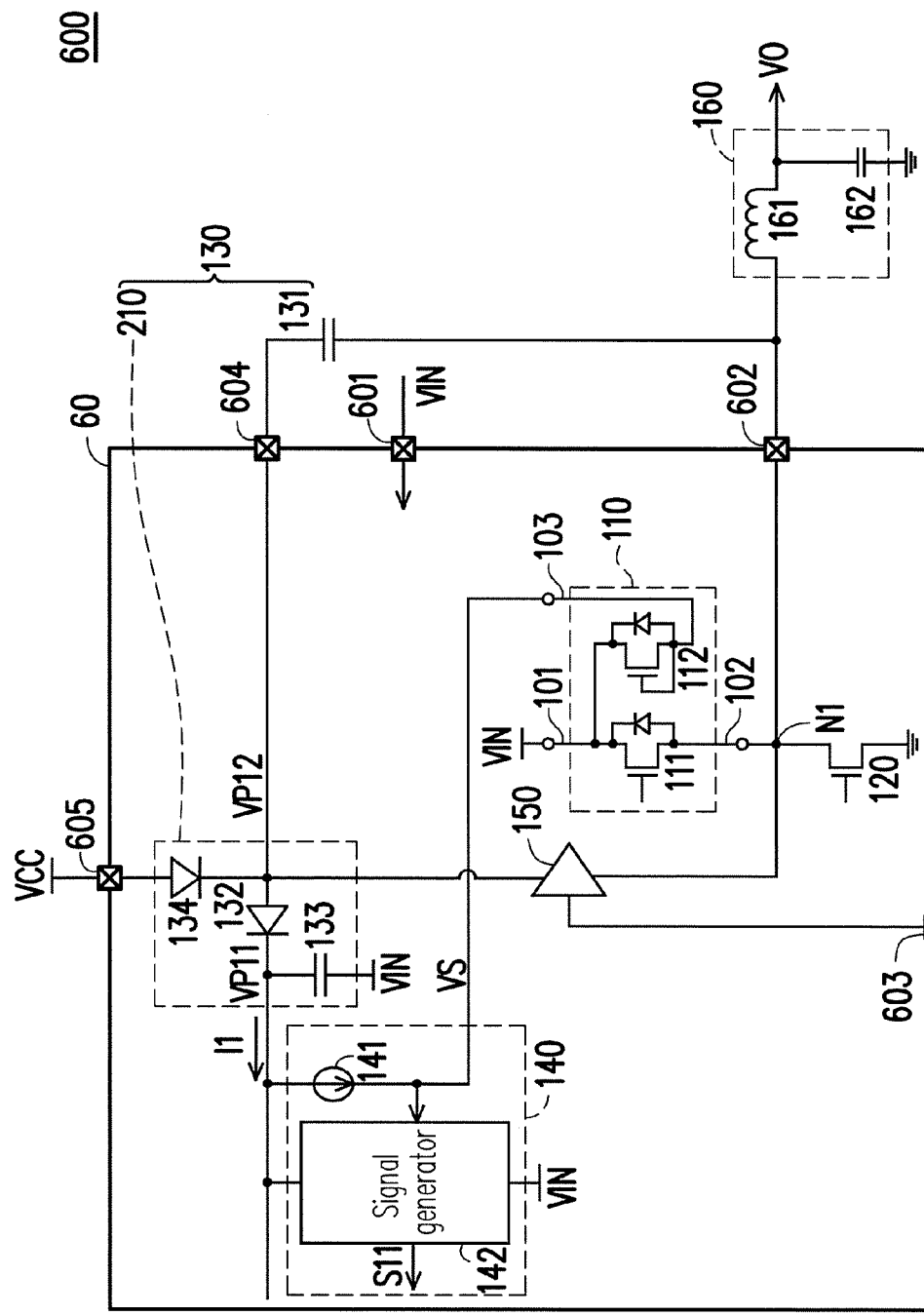
FIG. 6 is a schematic diagram illustrating a DC-to-DC converting circuit according to another embodiment of the invention.

In another embodiment, the power switch unit 110 may not be an independent integrated circuit, and the power switch unit 110 may be integrated together with the second power switch 120 in the integrated circuit 20 of the power circuit. For instance, FIG. 6 is a schematic diagram illustrating a DC-to-DC converting circuit according to another embodiment of the invention. As compared to the embodiment of FIG. 1, the boost component 210, the sensing circuit 140, the driver 150, the power switch unit 110, and the second power switch 120 of the DC-to-DC converting circuit 600 of FIG. 6 can be integrated in an integrated circuit 60 and can be used to form a DC-to-DC controller.

The integrated circuit 60 of the power circuit receives the input voltage VIN and is connected to the bootstrap capacitor 131. Moreover, the integrated circuit 60 of the power circuit further includes an input pin 601, an output pin 602, a pulse width modulation pin 603, an external pin 604, and an input pin 605. The input pin 601 receives the input voltage VIN. The output pin 602 is connected to the phase node N1. The pulse width modulation pin 603 receives the pulse width modulation signal S12, and the pulse width modulation signal S12 is configured to control the first power switch 111. The boost component 210 is electrically connected to the bootstrap capacitor 131 through the external pin 604. The input pin 605 receives the power supply voltage VCC. Details regarding the operations of each component of the DC-to-DC converting circuit 600 in the embodiment of FIG. 6 are already described in the various embodiments above, and thus will not be repeated.

Figure 7:
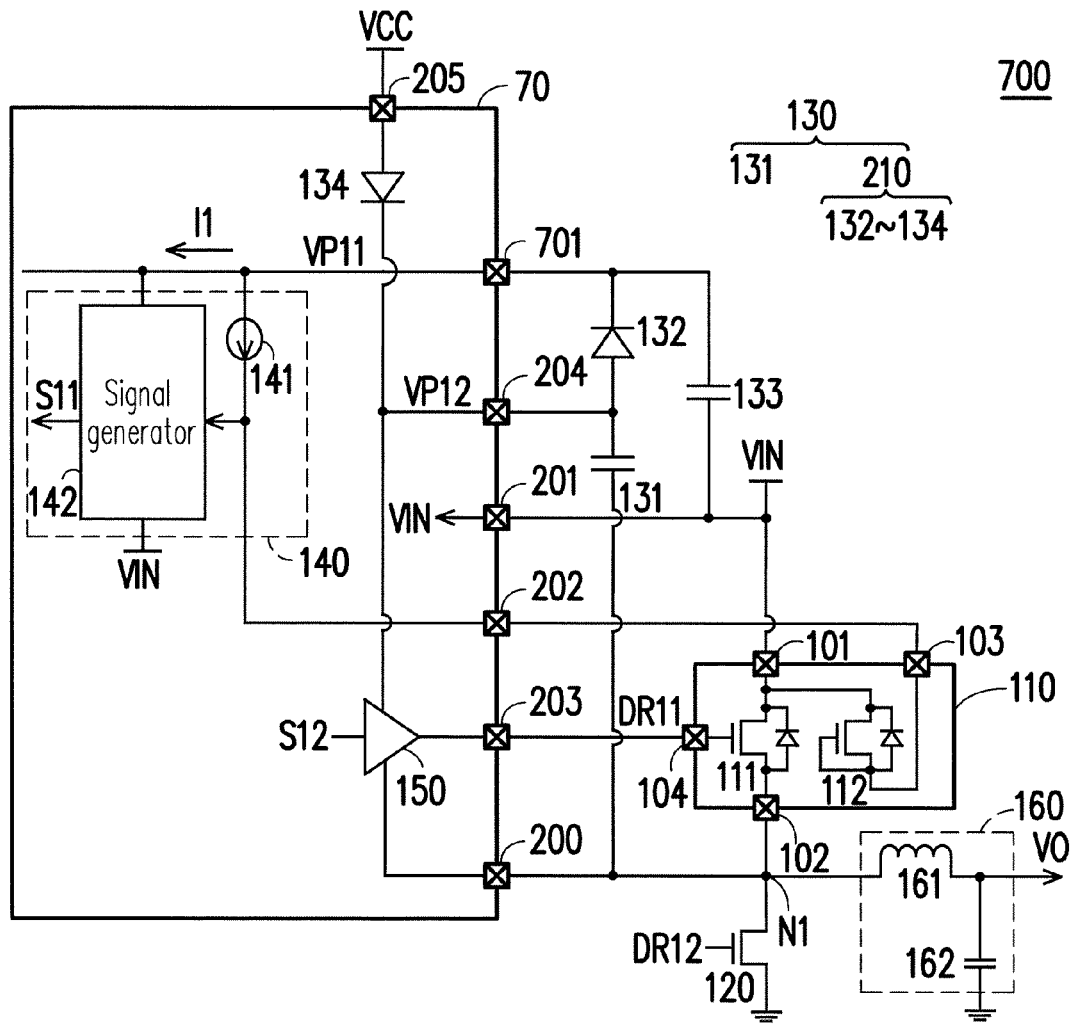
FIG. 7 and FIG. 8 are schematic diagrams respectively illustrating a DC-to-DC converting circuit according to yet another embodiment of the invention.
Figure 8:
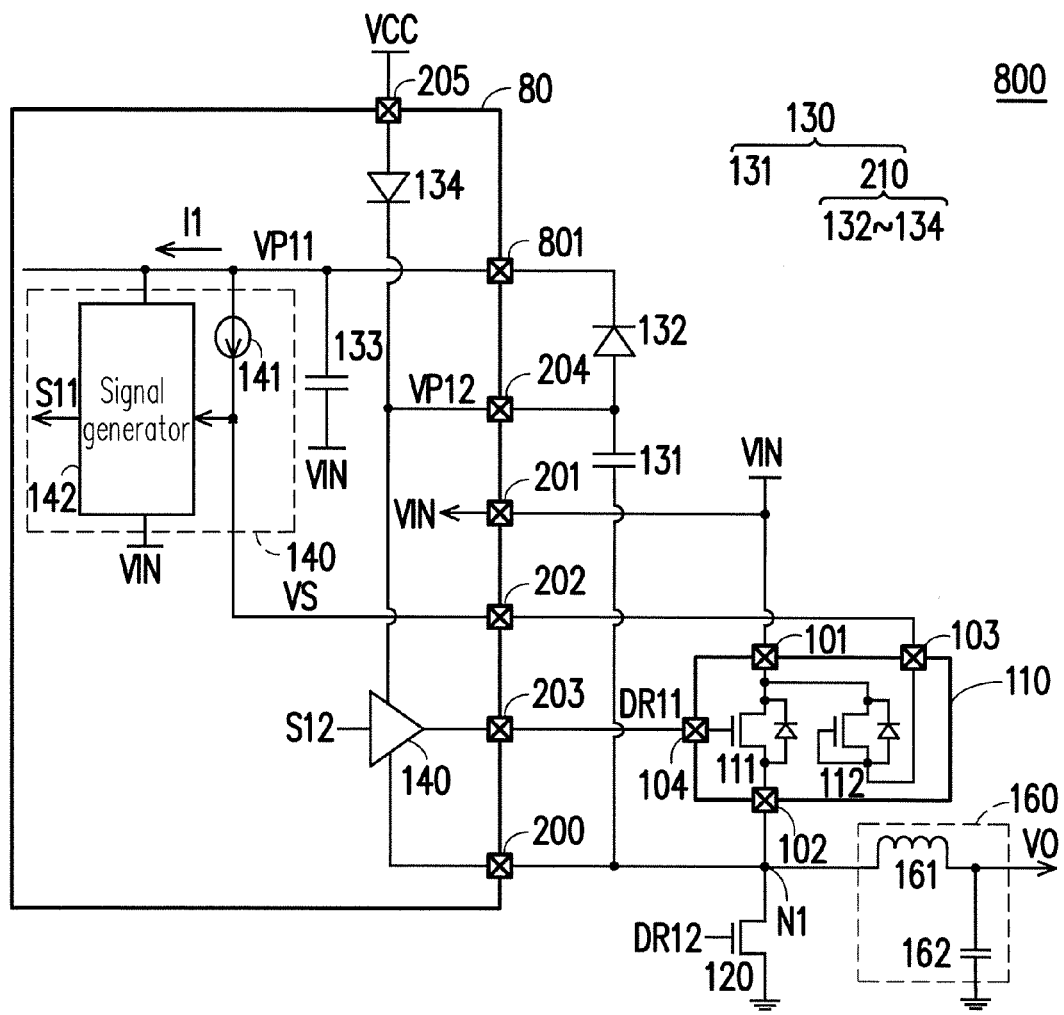

In another embodiment, those skilled in the art can also integrate only a part of the boost component 210 into the integrated circuit of the power circuit. For instance, FIG. 7 and FIG. 8 are schematic diagrams respectively illustrating a DC-to-DC converting circuit according to yet another embodiment of the invention. As compared to the embodiment of FIG. 1, the DC-to-DC converting circuit 700 of FIG. 7 further includes a sixth pin 701, and the second current limiting element 134 in the boost component 210, the sensing circuit 140 and the driver 150 are integrated in an integrated circuit 70 and are used to form a DC-to-DC controller. In addition, the integrated circuit 70 of the power circuit is electrically connected to the first current limiting element 132 and the capacitor 133, which are disposed at the outside, through the sixth pin 701. Details regarding the operations of each component of the DC-to-DC converting circuit 700 in the embodiment of FIG. 7 are already described in the various embodiments above, and thus will not be repeated.

On the other hand, as compared to the embodiment of FIG. 1, the DC-to-DC converting circuit 800 of FIG. 8 further includes a sixth pin 801, and the second current limiting element 134 and the capacitor 133 in the boost component 210, the sensing circuit 140 and the driver 150 are integrated in an integrated circuit 80 and are used to form a DC-to-DC controller. In addition, the integrated circuit 80 of the power circuit is electrically connected to the first current limiting element 132, which is disposed at the outside, through the sixth pin 801. Details regarding the operations of each component of the DC-to-DC converting circuit 800 in the embodiment of FIG. 8 are already described in the various embodiments above, and thus will not be repeated.

In summary, the DC-to-DC converting circuit and the integrated circuit of the power circuit of the invention can use the boosted circuit formed by the boost component and the bootstrap capacitor to boost the input voltage to the first operation voltage and then use the first operation voltage to supply power to the sensing element in the power switch unit. As a result, during the period of performing the power conversion, the sensing element in the power switch unit can operate normally, thereby increasing the detection accuracy of the DC-to-DC converting circuit and being conducive for the DC-to-DC converting circuit to achieve the effect of over-temperature protection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A DC-to-DC converting circuit, receiving an input voltage, the DC-to-DC converting circuit comprising:
    a power switch unit, comprising a first power switch, a sensing element, a first end, a second end, and a sensing end, wherein the sensing element is connected to the sensing end and the first end, and the first end is connected to the input voltage;
    a second power switch, connected to the first power switch;
    a phase node, located between the power switch unit and the second power switch and connected to the second end;
    a boosted circuit, connected to the first end and the second end, boosting the input voltage to a first operation voltage, and providing the first operation voltage to the sensing end, wherein the first operation voltage is higher than the input voltage; and
    a sensing circuit, connected to the boosted circuit and the sensing end to obtain a sensing voltage.

2. The DC-to-DC converting circuit as recited in claim 1, wherein the boosted circuit comprises:
    a bootstrap capacitor, through which the boosted circuit generates a second operation voltage;
    a first current limiting element, connected to the bootstrap capacitor; and
    a capacitor, connected between the first current limiting element and the input voltage, and the boosted circuit generating the first operation voltage through the capacitor.

3. The DC-to-DC converting circuit as recited in claim 2, wherein the first current limiting element includes a switch, and the switch is synchronized with the first power switch.

4. The DC-to-DC converting circuit as recited in claim 2, further comprising:
    a driver, of which a first power supply end receiving the second operation voltage, a second power supply end of the driver being connected to the phase node, and an output end of the driver being connected to a control end of the first power switch.

5. An integrated circuit of a power circuit, the integrated circuit being connected to a power switch unit, a second power switch and a bootstrap capacitor and receiving an input voltage, the power switch unit comprising a first power switch, a sensing element, a first end, a second end, and a sensing end, the sensing element being connected to the sensing end and the first end, the first end being connected to the input voltage, the second power switch being connected to the first power switch, and the integrated circuit comprising:
    a phase pin, connected to the second power switch and the second end of the power switch unit;
    a boost component, connected to the first end and the bootstrap capacitor, the boost component and the bootstrap capacitor boosting the input voltage to a first operation voltage and providing the first operation voltage to the sensing end, wherein the first operation voltage is higher than the input voltage; and
    a sensing circuit, connected to the boost component and the sensing end to obtain a sensing voltage.

6. The integrated circuit as recited in claim 5, wherein the boost component comprises:
    a first current limiting element, connected to the bootstrap capacitor; and
    a capacitor, connected between the first current limiting element and the input voltage, and the capacitor generating the first operation voltage.

7. The integrated circuit as recited in claim 6, wherein the first current limiting element includes a switch, and the switch is synchronized with the first power switch.

8. The integrated circuit as recited in claim 5, wherein the boost component and the bootstrap capacitor form a boosted circuit, the boosted circuit generates a second operation voltage through the bootstrap capacitor, and the integrated circuit further comprises:
    a driver, of which a first power supply end receiving the second operation voltage, a second power supply end of the driver being connected to the phase pin, and an output end of the driver being connected to a control end of the first power switch.

9. The integrated circuit as recited in claim 5, further comprising:
    a first pin, receiving the input voltage; and
    a second pin, connected to the sensing element of the power switch unit, the integrated circuit sending the first operation voltage to the sensing element through the second pin.

10. An integrated circuit of a power circuit, the integrated circuit receiving an input voltage and being connected to a bootstrap capacitor, and the integrated circuit comprising:
    a power switch unit, comprising a first power switch, a sensing element, a first end, a second end, and a sensing end, the sensing element being connected to the sensing end and the first end, and the first end being connected to the input voltage;
    a second power switch, connected to the first power switch;
    a phase node, connected to the second power switch and the second end; and
    a boost component, connected to the first end and the bootstrap capacitor, and the boost component and the bootstrap capacitor boosting the input voltage to a first operation voltage and providing the first operation voltage to the sensing end, wherein the first operation voltage is higher than the input voltage.

11. The integrated circuit as recited in claim 10, further comprising:
    a sensing circuit, connected to the boost component and the sensing end to obtain a sensing voltage.

12. The integrated circuit as recited in claim 10, wherein the boost component comprises:
    a first current limiting element, connected to bootstrap capacitor; and
    a capacitor, connected between the first current limiting element and the input voltage, and the capacitor generating the first operation voltage.

13. The integrated circuit as recited in claim 12, wherein the first current limiting element includes a switch, and the switch is synchronized with the first power switch.

14. The integrated circuit as recited in claim 10, wherein the boost component and the bootstrap capacitor form a boosted circuit, the boosted circuit generates a second operation voltage through the bootstrap capacitor, and the integrated circuit further comprises:
  a driver, of which a first power supply end receiving the second operation voltage, a second power supply end of the driver being connected to the phase node, and an output end of the driver being connected to a control end of the first power switch.

15. The integrated circuit as recited in claim 10, further comprising:
  an input pin, receiving the input voltage;
  an output pin, connected to the phase node; and
  a pulse width modulation pin, receiving a pulse width modulation signal for controlling the first power switch.

* * * * *